(12) United States Patent
Nagendra et al.

(10) Patent No.: US 6,358,582 B1
(45) Date of Patent: Mar. 19, 2002

(54) LAMINATED COMPOSITE SHELL ASSEMBLY FOR MAGNET APPLICATIONS

(75) Inventors: Somanath Nagendra; Evangelos Trifon Laskaris, both of Niskayuna, NY (US); Xianrui Huang, Florence, SC (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/196,423

(22) Filed: Nov. 19, 1998

(51) Int. Cl.[7] .................................................. H01F 7/22

(52) U.S. Cl. .................. 428/36.3; 428/36.4; 428/36.91; 335/216

(58) Field of Search ............................... 428/36.3, 36.4, 428/36.91; 335/216; 138/174

(56) References Cited

U.S. PATENT DOCUMENTS

| | | | |
|---|---|---|---|
| 3,963,882 A | * 6/1976 | Lewis | 179/115.5 |
| 4,287,495 A | * 9/1981 | Lund, Jr. et al. | 333/239 |
| 4,496,073 A | * 1/1985 | Silver et al. | 220/445 |
| 4,502,296 A | 3/1985 | Ogata et al. | 62/514 R |
| 4,800,354 A | * 1/1989 | Laskaris | 335/216 |
| 5,446,433 A | * 8/1995 | Laskaris et al. | 335/216 |
| 5,530,413 A | 6/1996 | Minas | 335/216 |
| 5,554,430 A | * 9/1996 | Pollatta et al. | 428/113 |
| 5,563,566 A | 10/1996 | Laskaris | 335/216 |
| 6,002,315 A | * 12/1999 | Heiberger et al. | 335/216 |

OTHER PUBLICATIONS

"Composite Sandwich Structure Optimization with Application to Satellite Components," Srinivas Kodiyalam, Somanath Nagendra and Joel DeStefano. AIAA Journal, vol. 34, No. 3, Mar. 1996. 614–621.

"Optimal Stacking Sequence Design of Stiffened Composite Panels with Cutouts, " Jul. 1994 Somanath Nagendra, Raphael T. Haftka and Zafer Gurdal. Virginia Polytechnic Institute and State University, Center for Composite Materials and Structures. CCMS–94–07, pp. ii, iii, 74–110.

Gunther Hartwig, "Support Elements With Extremely Negative Thermal Expansion," Cryogenics, 1995, vol. 35, No. 11, pp. 717 & 718.

* cited by examiner

Primary Examiner—Blaine Copenheaver
Assistant Examiner—Alicia Chevalier
(74) Attorney, Agent, or Firm—Lester Hale; Donald S. Ingraham

(57) ABSTRACT

A uniform stiffness laminated composite shell assembly includes a plurality of composite shells. The shells are made of layers of laminates of graphite-epoxy material having fibers oriented in various stacking sequences for performing different functions in the assembly. The shells are concentrically assembled in a desired sequence with some of the adjacent ones of the shells being at least equal to or greater in axial length than others thereof and with some of the shells being adapted to perform a structural load bearing function while others of the shells being adapted to perform a load transfer function. The desired sequence of shells of the composite shell assembly provides enhanced thermal insulating properties and efficient load distributing properties for enabling use of the assembly as a tube suspension in a superconductive magnet.

38 Claims, 2 Drawing Sheets

$$C1 = L1 + L2 + L3$$
$$C2 = L2 + L3$$
$$C3 = L3$$
$$C4 = L3 + L4 + L5$$
$$C5 = L5 + L4 + L3$$
$$C6 = L3$$
*Fig. 2*
| L1 | $[(45/-45)_2 / 90_2 / (45/-45)_2 / 0_5 / (-45/45)_2 / 90_2 / (-45/45)_2]_t$ |
|---|---|
| L2 | $[(45/-45) / 90 / 0_3 / 90 / (-45/45)]_t$ |
| L3 | $[(45/-45) / 90 / 0_3 / 90 / (-45/45)]_t$ |
| L4 | $[(45/45)]_t$ ADHESIVEBOND |
| L5 | $[(45/-45)_2 / 90_2 / (45/-45)_2 / 0_5 / (-45/45)_2 / 90_2 / (-45/45)_2]_t$ |
*Fig. 3*
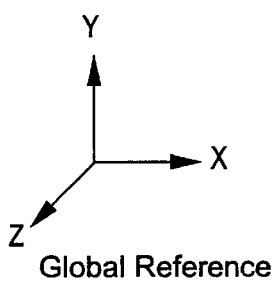
Global Reference
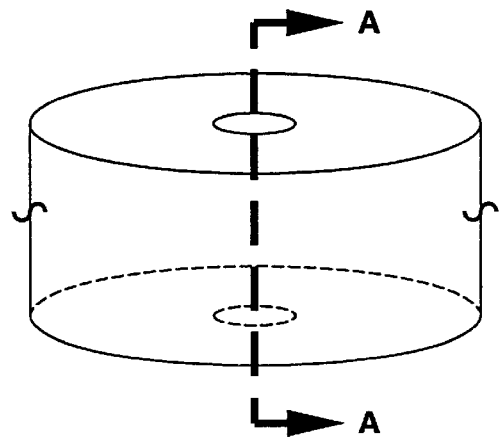
*Fig. 4*

LAMINATED COMPOSITE SHELL ASSEMBLY FOR MAGNET APPLICATIONS

BACKGROUND OF THE INVENTION

The present invention generally relates to tube suspension systems for magnets and, more particularly, is concerned with a laminated composite shell assembly with enhanced thermal insulating and efficient load distributing properties for enabling use in magnet applications such as in superconductive magnets operating at cryogenic temperatures.

Superconductive magnets include superconductive coils which generate uniform and high strength magnetic fields, such as used, without limitation, in magnetic resonance imaging (MRI) systems employed in the field of medical diagnostics. The superconductive coils of the magnet typically are enclosed in a cryogenic vessel surrounded by a vacuum enclosure and insulated by a thermal shield interposed therebetween.

Various designs of tube suspensions are employed to support the cryogenic vessel of a superconductive coil assembly of the magnet from and in spaced apart relation to both the thermal shield and the vacuum enclosure of the magnet. As one example, the tube suspension can include overlapped fiberglass outer and inner support cylinders, such as disclosed in U.S. Pat. No. 5,530,413 to Minas et al. which is assigned to the same assignee as the present invention. In the Minas et al. tube suspension, the outer support cylinder is located within and generally spaced apart from the vacuum enclosure and positioned outside of and generally spaced apart from the thermal shield. A first end of the outer support cylinder is rigidly connected to the vacuum enclosure while a second end of the outer support cylinder is rigidly connected to the thermal shield. The inner support cylinder is located within and generally spaced apart from the thermal shield and is positioned outside of and generally spaced apart from the superconductive coil assembly. The inner support cylinder has a first end rigidly connected to the thermal shield near the second end of the outer support cylinder and has a second end located longitudinally between the first and second ends of the outer support cylinder and rigidly connected to the superconductive coil assembly.

Problems can occur, however, with some designs of tube suspension systems at cryogenic temperatures. For instance, tube suspensions of some current superconductive magnet designs in MRI systems employ metal alloys or glass-epoxy materials. Metal alloys as well as glass-epoxy materials do not provide optimal load distributing and thermal insulating characteristics. Further, metal alloys are heavy and glass-epoxy materials deform as they tend to be compliant.

Consequently, a need exists for innovation with respect to tube suspensions for supporting superconductive magnets which will provide a solution to the aforementioned problems.

BRIEF SUMMARY OF THE INVENTION

The present invention provides a uniform stiffness laminated composite shell assembly designed to satisfy the aforementioned need. The uniform stiffness composite shell assembly of the present invention has a sequence of composite shells with different laminates having different stacking sequences and employing graphite-epoxy material that provide enhanced thermal insulating and efficient load distributing properties for enabling use in cryogenic applications. The sequence of composite shells provides the combination of properties needed for accommodating extreme environments, such as one whose temperature ranges between 4° K and 300° K.

In an embodiment of the present invention, a uniform stiffness laminated composite shell assembly is provided which can be used in a tube suspension for a superconductive magnet. The laminated composite shell assembly includes a plurality of composite shells with substantially cylindrical configurations and predetermined axial directions. Each shell is made of composite layers of laminates having fibers (e.g., fibers wound into layers) with the fibers being oriented in a plurality of stacking sequences with reference to the axial direction of the shell. The fibers of the shells are made of graphite-epoxy material. The shells are concentrically assembled in a desired sequence with some of the shells being adapted to perform a structural load bearing function while others of the shells are adapted to perform a load transfer function. Some of adjacent ones of the shells in the desired sequence thereof are at least equal to or greater in axial length than others of the adjacent ones of the shells. The stacking sequences are selected to provide a ratio of axial-to-radial stiffness for extensional stiffness of approximately unity ensuring that each of the shells has uniform extension stiffness. The stacking sequences also are selected to provide a ratio of axial-to-radial stiffness for flexural stiffness of each of the shells of approximately unity ensuring that each of the shells has uniform flexural stiffness.

BRIEF DESCRIPTION OF THE DRAWINGS

FIG. 2 is a chart of various laminates in the composite shells of the assembly of FIG. 1.

FIG. 3 is a chart of the laminate stacking sequence and orientation of fibers of the various laminates in each of the composite shells of the assembly of FIG. 1.

FIG. 4 is a three dimensional view of the vacuum enclosure depicting a section A—A in the "Y" direction.

DETAILED DESCRIPTION OF THE INVENTION

Figure 1:
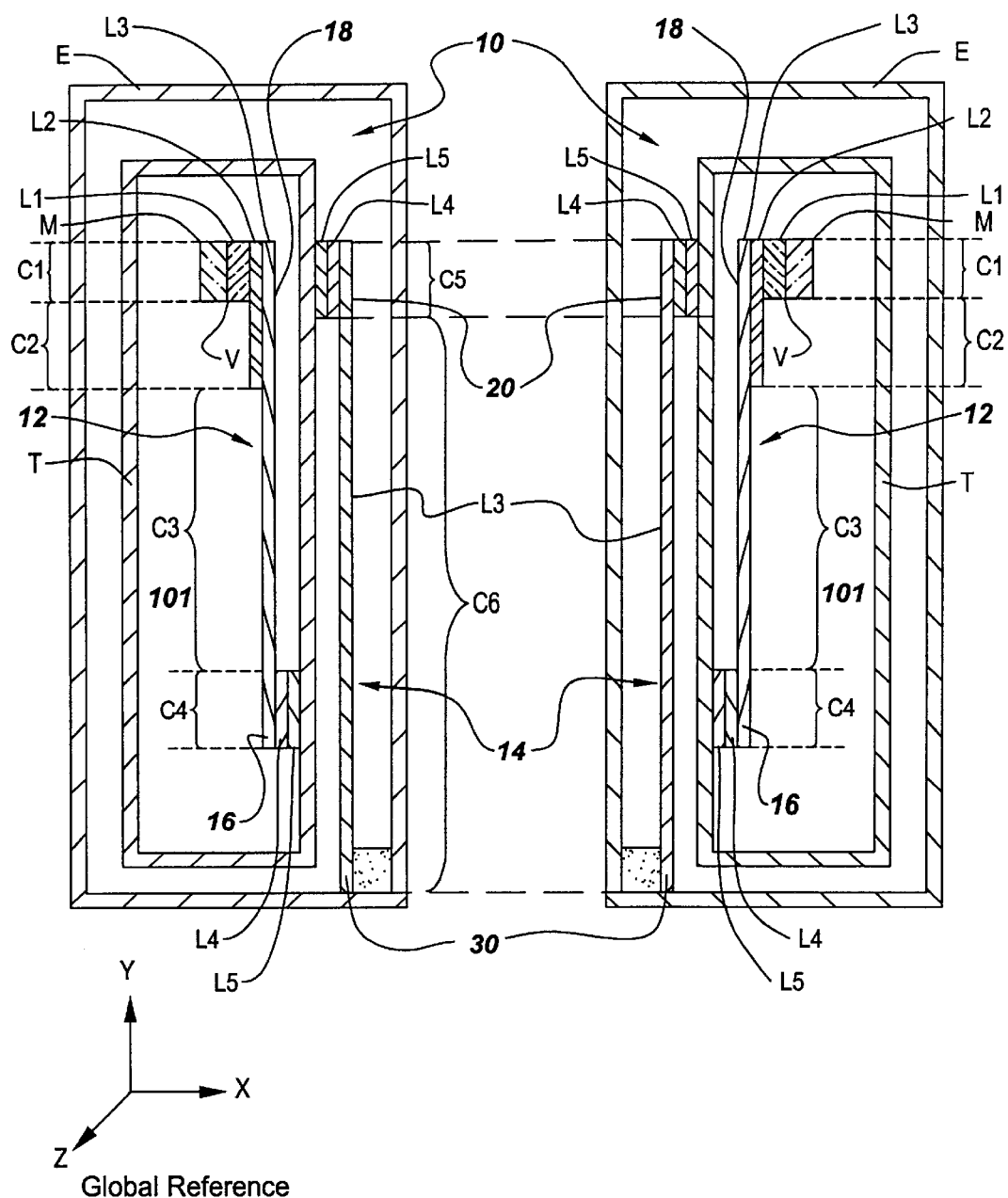
FIG. 1 is a schematic cross-sectional view through section A—A, as shown in FIG. 4, of a laminated composite shell assembly of the present invention.

Referring now to the drawings and particularly to FIG. 1, there is illustrated a laminated composite shell assembly, generally designated 10, provided as a tube suspension for a superconductive magnet such as used in MRI systems. As is well-known, a superconductive MRI magnet typically has a longitudinal central axis and includes a superconductive coil assembly M at cryogenic temperature, a thermal shield T enclosing the coil assembly and a vacuum enclosure E at ambient temperature enclosing the thermal shield. The coil assembly, thermal shield and vacuum enclosure are radially spaced from one another with reference to the longitudinal axis and are coaxially aligned with the longitudinal axis. The coil assembly includes a cryogenic vessel V containing a cryogenic fluid 101 and superconductive coils. The vacuum enclosure, thermal shield and cryogenic vessel are in the form of tubular shells of annularly cylindrical configurations. An example of an open-type MRI magnet is found in U.S. Pat. No. 5,563,566 to Laskaris et al. whereas an example of a closed-type MRI magnet is found in aforecited U.S. Pat. No. 5,530,413. Both of these patents are assigned to the assignee of the present invention.

The tube suspension implemented by the composite shell assembly 10, and identified in FIG. 1 by the same reference numeral, is employed between the cryogenic vessel, thermal shield and vacuum enclosure, respectively, so as to allow both radial and axial movement of the cryogenic vessel and thus the coil assembly relative to the thermal shield and vacuum enclosure as the temperature of the cryogenic vessel changes between from ambient and cryogenic temperatures. As seen in exaggerated schematical form in FIG. 1, the composite shell assembly 10 can include a pair of inner and outer support cylinders 12, 14 axially overlapped with each other and substantially concentrically arranged with one another. The inner support cylinder 12 is located within and generally spaced apart from the thermal shield T and is positioned outside of and generally spaced apart from the cryogenic vessel, being represented by a dashed line V in FIG. 1. The inner support cylinder 12 has a first end 16 rigidly connected to one end of the thermal shield T and a second end 18 rigidly connected to the cryogenic vessel V. The outer support cylinder 14 is located within and generally spaced apart from the vacuum enclosure E in FIG. 1 and is positioned outside of and generally spaced apart from the thermal shield T. The outer support cylinder 14 has a first end 30 rigidly connected to the vacuum enclosure E and a second end 20 rigidly connected to an opposite end of the thermal shield T. As apparent in FIG. 1, the second end 20 of the outer support cylinder 14 is axially displaced from and generally overlapped with the first end 16 of the inner support cylinder 12.

Referring to FIGS. 1 and 2, the present invention provides a set of composite shells C, such as ones made up of graphite-epoxy material, such as T300/N5208, that can be assembled to form a desired sequence of composite shells C of various laminates L and thereby provide the inner and outer support cylinders 12, 14 of the composite shell assembly 10. In the illustrated embodiment of FIG. 1 and as per chart 22 of FIG. 2, there are composite shells C1 to C6 assembled in a desired sequence. Each shell C1 to C6 contains at least one of the laminates L1 to L5. Each of the laminates L1 to L5 and thus each of the composite shells C1 to C6 formed thereof is substantially a cylinder which includes a slightly tapering cylinder having a small angle of taper of about 1.6 degrees relative to its central axis. It can be noted in FIG. 1 that certain of adjacent ones of the laminates, such as L4 and L5 in the desired sequence of the shells are at least equal in axial length to one another. It can also be noted in FIG. 1 that certain of adjacent ones of the laminates, such as L3, L2 and L1, in the desired sequence of the shells are successively greater in axial length than the other.

Referring to FIG. 3, in a chart 24 there is illustrated the laminate stacking sequences that can be used in the construction of the various laminates L making up the various composite shells C. The laminate stacking sequences identify the orientation of the fibers in different composite layers with respect to the axial direction of the shell C. The off-axis orientations or +/−45° fibers are with reference to the axial direction of the composite shells C. When a composite layer is created by adjacent windings of a matrix-coated fiber, such as an epoxy-coated graphite-fiber thread (or tow), the laminate stacking sequences identify the winding orientation of the fibers. The 90° fibers are oriented along the hoop (or circumferential) direction (orthogonal to the axial direction) of the composite shells C whereas the 0° fibers are oriented along the axial direction of the composite shells C. The subscript "t" means the number of times the fiber layer stacking sequence is repeated.

The resultant laminates are designed to efficiently carry load and distribute the load both axially as well as circumferentially along the composite shells C. The fiber layer stacking sequences of the various laminates L comprising the composite shells C ensure that the ratio (NR) of axial to radial (or hoop) stiffness, both for extension as well as for flexure, as set forth in Table I, are close to unity, that is, approximately one. (The A/R values of the extension stiffness are on the left side of the slash mark and the A/R values of the radial stiffness are on the right side of the slash mark in the last column of Table I.)

TABLE I

| Composite Shell | Extension Stiffness | | Flexural Stiffness | | Ratio |
|---|---|---|---|---|---|
| | Axial | Radial | Axial | Radial | A/R |
| C1 | 25.26 | 21.51 | 9.20 | 8.56 | 1.17/1.07 |
| C2 | 11.62 | 9.11 | 0.71 | 0.62 | 1.27/1.14 |
| C3 | 5.81 | 4.55 | 0.06 | 0.08 | 1.27/0.75 |
| C4 | 19.69 | 17.19 | 4.97 | 5.00 | 1.14/0.99 |
| C5 | 13.64 | 12.39 | 1.19 | 1.87 | 1.10/0.64 |
| C6 | 19.69 | 17.19 | 4.97 | 5.00 | 1.14/0.99 |

Extension stiffness is terminology used to identify behavior of the shell which all takes place in-plane, that is, in the curvature of the shell. Flexural stiffness involves the bending behavior of the shell. The two behaviors, extensional and flexural, differ in that extensional behavior is "in-plane deformation" while flexural behavior is "out-of-plane" deformation. The "plane" referred to is the "plane of curvature" of the shell. Any behavior that acts along axes, such as a lengthwise axis and a directional through-the-thickness axis, coincident with the plane of curvature, that is, at any point on the curvature of the shell, involves the extensional behavior and relates to the extensional stiffness of the shell. By contrast any behavior that acts out of the plane of curvature of the shell, such as bending behavior, is flexural behavior and relates to the flexural stiffness of the shell. Each type of behavior (extensional and flexural) has an axial component which acts along the length of the shell and a hoop component which acts along the curvature of the shell. The goal is for the axial-to-radial ratio (A/R) for each type of behavior to equal one which means uniform stiffness behavior.

The ratio being close to unity or to one ensures that the effective laminate designs have uniform stiffness for all composite shells C. The effective response measure for stiffness is an estimate of the frequency of the assembled structure. The modal frequency of the first critical mode (without attached masses) is 207.73 Hz. The modal frequency of the first critical mode (with attached masses) is 31.81 Hz.

It will be observed that the laminate L1 has a stacking sequence identical to that of laminate L5, and laminate L2 has a stacking sequence identical to that of laminate L3, but the identical laminates are found at different locations in the composite shells C made up of the laminate L1 to L5. Thus, even though the laminates L are identical with respect to their stacking sequences, they are identified as different laminates, have different L numbers, because their functionality is different. For example, with respect to composite shell C2, being made up of identical laminates L2 and L3, laminate L3 provides or forms a structural component performing a structural function while laminate L2 provides or forms a transitional component performing a load transition function into the structure laminate L3. So laminate L2 is there to provide compatibility between shells C1 and C2. So the functional behavior of certain shells are different even though their laminates are identical. The same is true for laminates L1 and L5 although their state of stress and the joint functionality are different. With respect to laminate L1, it is behaving as an expansion component for the cryogenic vessel which is at around 4° K. With respect to laminate L5 (having the same stacking sequence as laminate L1), it is behaving as a continuity component at the one end of the thermal shield T which is at around 300° K. So in one location it (the same laminate with a particular stacking sequence) functions as a continuity component while in the other case it functions as an expansion component. The laminate L4 contains the adhesive bond between laminates L5 of shells C4 and C5 and the thermal shield T.

Composite shells C1 and C2 are joined only at certain locations, that being, at laminates L2 and L3 which are common between shells C1 and C2. Laminates L1 and L2 must satisfy certain conditions of continuity between shells C1 and C2. These conditions of continuity that must be satisfied are displacement compatibility, strain compatibility and load transfer between the two shells. The same holds true between shells C2 and C3, between shells C3 and C4, between shells C4 and C5, and shells C5 and C6. So the provision of a sequence of shells C having various combinations of laminates L is basically a means by which one can ensure these conditions of displacement, strain and load continuities are satisfied between any two adjacent shells.

Composite shell C1 is associated with a flange of the cryogenic vessel V. The behavior of shell C1 is very different from the behavior of shell C2. The behavior of shell C1 is to act to transfer the load from the cryogenic vessel V to the composite shell assembly 10. That particular flange, shell C1, has to move radially and axially. Allowance for the shell C1 to expand is also a function of shell C2 which has to accommodate that expansion. Shell C2 has to give the appropriate stiffness relaxation to allow the movement of shell C1. Shell C1 creates stress, which has to be transferred into shell C3 via shell C2. That is why the laminate L2 is provided to perform the function of transferring that stress into shell C3 from shell C1.

In conclusion, the composite shell assembly 10 can be the main suspension for the superconductive magnet that mounts the cryogenic vessel V to the vacuum enclosure E. At the middle is the re-entrant cylinder with the thermal shield T to insulate the colder inside environment of the cryogenic vessel V from the warmer outside environment of the vacuum enclosure E. This composite shell assembly 10 acts as both a thermal insulator and a load transfer mechanism acting to transfer the load from the cryogenic vessel V to the vacuum enclosure E.

It is thought that the present invention and its advantages will be understood from the foregoing description and it will be apparent that various changes may be made thereto without departing from the spirit and scope of the invention or sacrificing all of its material advantages, the above-described embodiment(s) being merely exemplary thereof.

What is claimed is:

1. A laminated composite shell assembly for use as a tube suspension in a magnet, said assembly comprising:
    a plurality of laminated composite shells assembled to one another and having a plurality of adhesive bonds at which said shells are connected to an external structure;
    said composite shells being substantially cylindrical in configuration and having an axial direction;
    each of said shells being made of composite layers of laminates having fibers oriented in a plurality of stacking sequences with reference to an axial direction of said shell; and
    said composite shells being concentrically assembled together in an axially adjoining sequence of laminates axially overlapping each other only in part, wherein some of said shells perform a structural load bearing function in supporting said magnet while others of said shells perform a load transfer function; wherein said shells provide required said structural load bearing function and said load transfer function at respective areas of adhesive bond locations without additional mechanical means disposed adjacent said adhesive bond locations.

2. The assembly of claim 1 in which at least some of said stacking sequences have said fibers in a layer oriented at about +45° with reference to said axial direction of said shells.

3. The assembly of claim 1 in which at least some of said stacking sequences have said fibers in a layer oriented at about −45° with reference to said axial direction of said shells.

4. The assembly of claim 1 in which at least some of said stacking sequences have said fibers in a layer oriented at about 90° with reference to said axial direction of said shells.

5. The assembly of claim 1 in which at least some of said stacking sequences have said fibers in a layer oriented at about 0° with reference to said axial direction of said shells.

6. The assembly of claim 1 in which said fibers of said shells are made of graphite in an epoxy matrix.

7. The assembly of claim 1 in which some of said laminates of said shells have substantially equal axial length.

8. The assembly of claim 1 in which some of said laminates of said shells have different axial lengths.

9. The assembly (10) of claim 1 in which said stacking sequences provide a ratio of axial-to-radial stiffness to ensure that each of said shells (C) has uniform extension stiffness.

10. The assembly (10) of claim 1 in which said stacking sequences provide a ratio of axial-to-radial stiffness to ensure that each of said shells (C) has uniform flexural stiffness.

11. A suspension according to claim 1 where said composite shells have different numbers of said laminates, with at least one common laminate axially overlapping concentrically therebetween.

12. A suspension according to claim 11 wherein said composite shells have different stacking sequences of said fibers in said laminates.

13. A suspension according to claim 12 wherein said laminations in said composite shells have different fiber stacking sequences for effecting different extension stiffness therebetween.

14. A suspension according to claim 12 wherein said laminations in said composite shells have different fiber stacking sequences for effecting different flexural stiffness therebetween.

15. A suspension according to claim 12 wherein said laminations in each of said shells has a fiber stacking sequence for effecting a ratio of axial-to-radial stiffness of about unity.

16. A suspension according to claim 15 wherein said stiffness ratio is about unity in extension.

17. A suspension according to claim 15 wherein said stiffness ratio is about unity in flexure.

18. A suspension according to claim 12 wherein said shells are configured in an axial assembly of four shells respectively having three, two, one, and three laminates corresponding therewith.

19. A suspension according to claim 12 wherein said shells are configured in an axial assembly of two shells respectively having three and one laminate corresponding therewith.

20. A suspension according to claim 12 wherein each shell is tapered axially.

21. A suspension according to claim 20 wherein each shell is tapered about 1.6 degrees.

22. A suspension according to claim 12 further comprising a cylindrical thermal shield fixedly joined concentrically to one of said shells for suspending said cryogenic vessel concentrically from an opposite one of said shells.

23. A suspension according to claim 22 wherein:

said shells are configured in an axial assembly of first, second, third, and fourth shells, with said fourth shell being fixedly joined to said thermal shield, and said first shell being sized to concentrically surround said cryogenic vessel;

said first shell has three laminates;

said second shell has two laminates;

said third shell has one laminate; and said fourth shell has three laminates.

24. A suspension according to claim 23 wherein:

said first and second shells share two laminates in common;

said second and third shells share one laminate in common; and said third and fourth shells share one laminate in common.

25. A suspension according to claim 24 wherein:

said first shell has two laminates with stacking sequences identical to each other and different than the third laminate; and said three laminates of said fourth shell have different stacking sequences from each other.

26. A suspension according to claim 24 further comprising:

a fifth cylindrical composite shell having a plurality of composite laminates surrounding said thermal shield, with one of said laminates being fixedly joined thereto; and a sixth cylindrical composite shell axially adjoining said fifth shell, and having a composite laminate shared in common with said fifth shell for supporting said thermal shield from a cylindrical vacuum enclosure.

27. A suspension according to claim 26 wherein said fifth shell includes three laminates having fibers of different stacking sequence.

28. A suspension according to claim 27 wherein said sixth shell has a single laminate shared in common with said fifth shell.

29. A suspension according to claim 28 wherein said fourth and fifth shells further comprise said adhesive bonds, wherein said fourth and said fifth shells are located opposite inner and outer surfaces, respectively, of said thermal shield.

30. A suspension according to claim 29 wherein each of said six shells has an axial taper of about 1.6 degrees.

31. A laminated composite shell assembly for use as a tube suspension in a magnet, said assembly comprising:

a plurality of laminated composite shells assembled to one another and having a plurality of adhesive bonds at which said shells are connected to an external structure;

said composite shells being substantially cylindrical in configuration and having an axial direction;

each of said composite shells being made of graphite fibers in an epoxy matrix wound into layers of laminates with fibers being oriented in a plurality of stacking sequences with reference to an axial direction of said shell; and said composite shells being concentrically assembled together in an axially adjoining sequence of laminates axially adjoining each other only in part, with said shells having different axial length; wherein some of said shells perform a structural load bearing function in supporting said magnet while others of said shells perform a load transfer function; wherein said shells provide required said structural load bearing function and said load transfer function at respective areas of adhesive bond locations without additional mechanical means disposed adjacent said adhesive bond locations.

32. The assembly of claim 31 in which at least some of said stacking sequences have said fibers in a layer wound at about +45° with reference to said axial direction of said shells.

33. The assembly of claim 31 in which at least some of said stacking sequences have said fibers in a layer wound at about −45° with reference to said axial direction of said shells.

34. The assembly of claim 31 in which at least some of said stacking sequences have said fibers in a layer wound at about 45° with reference to said axial direction of said shells, and some other fibers wound oppositely thereto at about −45°.

35. The assembly of claim 31 in which at least some of said stacking sequences have said fibers in a layer wound at about 90° with reference to said axial direction of said shells.

36. The assembly of claim 31 in which at least some of said stacking sequences have said fibers in a layer wound at about 0° with reference to said axial direction of said shells.

37. The assembly (10) of claim 31 in which said stacking sequences provide a ratio of axial-to-radial stiffness to ensure that each of said shells (C) has uniform extension stiffness.

38. The assembly (10) of claim 31 in which said stacking sequences provide a ratio of axial-to-radial stiffness to ensure that each of said shells (C) has uniform flexural stiffness.

* * * * *